(12) United States Patent
Murata et al.

(10) Patent No.: US 10,557,970 B2
(45) Date of Patent: Feb. 11, 2020

(54) QUANTUM DOT PROTECTIVE FILM, AND WAVELENGTH CONVERSION SHEET AND BACKLIGHT UNIT OBTAINED BY USING THE SAME

(71) Applicant: TOPPAN PRINTING CO., LTD., Tokyo (JP)

(72) Inventors: Koji Murata, Tokyo (JP); Kenji Matsumasa, Tokyo (JP); Kengo Okamura, Tokyo (JP); Satoshi Iwata, Tokyo (JP); Masato Kurokawa, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 113 days.

(21) Appl. No.: 15/719,712

(22) Filed: Sep. 29, 2017

(65) Prior Publication Data

US 2018/0024277 A1   Jan. 25, 2018

Related U.S. Application Data

(63) Continuation of application No. PCT/JP2016/060958, filed on Apr. 1, 2016.

(30) Foreign Application Priority Data

Apr. 2, 2015 (JP) ................. 2015-075753

(51) Int. Cl.
*G02B 1/14* (2015.01)
*F21V 9/30* (2018.01)
(Continued)

(52) U.S. Cl.
CPC ............ *G02B 1/14* (2015.01); *B32B 7/04* (2013.01); *F21V 9/30* (2018.02); *G02B 6/005* (2013.01); *B32B 2457/20* (2013.01)

(58) Field of Classification Search
CPC .. G02B 1/14; G02B 5/20; G02B 6/005; F21V 9/30; B32B 9/00; B32B 27/00; F21S 2/00; H01L 33/50; H05B 33/22
(Continued)

(56) References Cited

U.S. PATENT DOCUMENTS 5,773,126 A * 6/1998 Noritake .................. B05D 1/42
                                                       428/143
5,972,473 A * 10/1999 Arakawa ............... A61F 13/551
                                                       428/141
(Continued)

FOREIGN PATENT DOCUMENTS

CN    103487857        1/2014
EP    3 171 072 A1     5/2017
(Continued)

OTHER PUBLICATIONS

Extended European Search Report dated Sep. 5, 2018 in corresponding application No. 16773246.0.
(Continued)

*Primary Examiner* — Bryon T Gyllstrom
(74) *Attorney, Agent, or Firm* — Foley & Lardner LLP

(57) ABSTRACT

A quantum dot protective film for sealing a phosphor, including: a protective layer having foreign matter, the maximum size of which is 100 to 500 µm; and a coating layer formed on one surface of the protective layer, wherein the abundance ratio of the foreign matter with the maximum size of 100 to 500 µm is 0.01 to 5.0 particles/m$^2$ in the protective layer, and the haze value is 20% or higher.

12 Claims, 7 Drawing Sheets

(51) Int. Cl.
*B32B 7/04* (2019.01)
*F21V 8/00* (2006.01)

(58) Field of Classification Search
USPC .......................................................... 362/84
See application file for complete search history.

(56) References Cited

U.S. PATENT DOCUMENTS

| | | | | |
|---|---|---|---|---|
| 7,923,917 B2* | 4/2011 | Eida | .................. | B82Y 20/00 |
| | | | | 313/501 |
| 8,730,441 B2* | 5/2014 | Yoshihara | ................ | G02B 1/111 |
| | | | | 349/137 |
| 9,199,842 B2* | 12/2015 | Dubrow | ................ | B82Y 20/00 |
| 9,215,761 B2* | 12/2015 | van de Ven | ............ | H05B 33/02 |
| 9,678,256 B2* | 6/2017 | Miyata | ................... | G02B 5/208 |
| 9,739,910 B2* | 8/2017 | Nakata | ................... | G02B 5/305 |
| 9,841,150 B2* | 12/2017 | Tokinoya | ................. | B32B 27/36 |
| 10,215,907 B2* | 2/2019 | Oh | ............................ | F21V 9/30 |
| 2012/0113672 A1 | 5/2012 | Dubrow et al. | | |
| 2016/0327690 A1 | 11/2016 | Tokinoya et al. | | |
| 2016/0327719 A1* | 11/2016 | Kitahara | ................... | G02B 1/14 |
| 2019/0055467 A1* | 2/2019 | Ota | ............................ | B32B 9/00 |

FOREIGN PATENT DOCUMENTS

| | | |
|---|---|---|
| EP | 3 208 520 A1 | 8/2017 |
| JP | 2009-018568 | 1/2009 |
| JP | 2009-217107 | 9/2009 |
| JP | 2011-013567 | 1/2011 |
| JP | 2012-129195 | 7/2012 |
| JP | 2015-045768 | 3/2015 |
| WO | WO-2005-034582 | 4/2005 |
| WO | WO-2010-084923 | 7/2010 |
| WO | WO-2016-010116 | 1/2016 |
| WO | WO-2016-052626 | 4/2016 |
| WO | WO-2016-059843 | 4/2016 |

OTHER PUBLICATIONS

International Search Report issued in International Patent Application No. PCT/JP2016/060958 dated Jun. 28, 2016.

* cited by examiner

QUANTUM DOT PROTECTIVE FILM, AND WAVELENGTH CONVERSION SHEET AND BACKLIGHT UNIT OBTAINED BY USING THE SAME

CROSS-REFERENCE TO RELATED PATENT APPLICATIONS

This application is a continuation application filed under 35 U.S.C. § 111(a) claiming the benefit under 35 U.S.C. §§ 120 and 365(c) of International Application No. PCT/JP2016/060958, filed on Apr. 1, 2016, which is based upon and claims the benefit of priority of Japanese Patent Application No. 2015-075753, filed on Apr. 2, 2015, the entireties of which are hereby incorporated by reference.

TECHNICAL FIELD

The present invention relates to a quantum dot protective film, and a wavelength conversion sheet and a backlight unit that are obtained by using the quantum dot protective film.

BACKGROUND

A liquid crystal display is a display device in which a liquid crystal composition is used for display. The liquid crystal display is used as a display device for various machines, in particular, as an information display device or image display device.

The liquid crystal display shows an image by locally transmitting or blocking light using a liquid crystal panel in accordance with voltage application. Accordingly, to show an image on the liquid crystal display, a backlight is needed for a back surface of a liquid crystal panel. Conventionally, a cold cathode tube is used for such a backlight. In recent years, there are circumstances in which light emitting diodes (LEDs) are used instead of cold cathode tubes, for the reasons of having long service life, good color development, and the like.

Meanwhile, in recent years, nano-sized phosphors using quantum dots have been commercialized mainly by venture companies overseas. Quantum dots are luminescent semiconductor nano-particles and have a diameter in a range of 1 to 20 nm. The unique optical properties and electronic properties of the quantum dots are being utilized in many applications such as flat panel displays and illumination (decorative lighting) with a wide variety of colors, in addition to fluorescent imaging applications in the fields of biology and medical diagnosis.

White LED technology, which plays a supremely important role in displays, generally uses a method of exciting cerium-doped yttrium-aluminum-garnet (YAG-Ce) phosphors for down conversion, by means of a blue (450 nm) LED chip. When the blue light of the LED becomes admixed with the yellow light generated from the YAG phosphors with a wide wavelength range, white light is created. However, this white light commonly is somewhat bluish and therefore is taken to be a "cold" white or "cool" white.

The quantum dots exhibit a wide excitation spectrum and have high quantum efficiency and thus can be used as LED down conversion phosphors. Furthermore, the quantum dots can have an emission wavelength fully adjusted over the entire visible region by only altering the dot size or the type of the semiconductor material. Therefore, it is said that the quantum dots have the possibility of creating substantially any color, in particular, warm whites that are strongly desired in the illumination industry. In addition, combinations of three types of dots having emission wavelengths corresponding to red, green, and blue enable white lights having different color rendering indices to be obtained. Thus, a display provided with a backlight using quantum dots can improve color hue and can express up to 65% of the colors that can be distinguished by a person, without increasing the thickness, power consumption, costs, or manufacturing processes more than those of a conventional liquid crystal display.

The backlight is an optical instrument obtained by diffusing quantum dots having an emission spectrum of red or green into a film and sealing (covering) two main surfaces of the film with a barrier film or a lamination of barrier films, and the edge portions, as well as the main surfaces, are also sealed depending on a case.

Furthermore, it is suggested in PTL 1 that a layer having phosphors is inserted between barrier films to suppress degradation of the phosphors. Furthermore, it is suggested in PTL 2 that an organic EL device is coated with a gas barrier film to ensure the reliability of the organic EL device.

CITATION LIST

Patent Literature

PTL 1: JP 2011-013567 A
PTL 2: JP 2009-018568 A

SUMMARY OF THE INVENTION

Technical Problem

However, there is a case in which, if a scratch, a wrinkle, foreign matter, or the like is present in a quantum dot protective film, they appear as a defect when displaying a display. For such reasons, it is generally required for the quantum dot protective film to have an excellent outer appearance having no scratches, wrinkles, foreign matter, or the like. In addition, there is a case in which non-light emitting regions called dark spots may occur when the quantum dots are deteriorated. Because the dark spots appear as a defect when displaying a display, it is also required for the quantum dot protective film to have high barrier properties so as to avoid the occurrence of dark spots.

However, most conventional barrier films have just been used as a wrapping material for food products or medical products or as a packaging material for electronic devices or the like, and it has remained difficult to obtain satisfactory performance as a quantum dot protective film. Even if a display is produced by sealing quantum dots with a barrier film described in PTL 1 or PTL 2, the barrier properties remain insufficient, and thus there is a risk that dark spots may occur. Furthermore, for example, even when the constituent film is prepared in a clean room environment, there is a limit for reducing scratches, wrinkles, foreign matter, and the like. For such reasons, it cannot be said that the barrier film described in PTL 1 or PTL 2 is a barrier film which has sufficiently reduced recognizable defects in a display.

The present invention has been achieved under the circumstances described above, and an object of the invention is to provide a quantum dot protective film, a wavelength conversion sheet, and a backlight unit that are capable of reducing recognizable defects in a display.

Solution to Problem

The present invention provides a quantum dot protective film for sealing a phosphor, including: a protective layer having foreign matter, the maximum size of which is 100 to 500 μm; and a coating layer formed on one surface of the protective layer, wherein the abundance ratio of the foreign matter with the maximum size of 100 to 500 μm is 0.01 to 5.0 particles/m$^2$ in the protective layer, and the haze value is 20% or higher. According to the present invention, recognizable defects in a display can be reduced.

In the quantum dot protective film, the protective layer preferably has the foreign matter with a maximum size of 100 to 300 μm, and abundance ratio of the foreign matter with the maximum size of 100 to 300 μm is 0.1 to 2.0 particles/m$^2$. In the quantum dot protective film, the protective layer preferably has foreign matter with an average size of 200 to 500 μm, and the abundance ratio of the foreign matter with an average size of 200 to 500 μm is 3.0 particles/m$^2$ or less. In the quantum dot protective film, the protective layer preferably includes a barrier film in which a substrate layer and a barrier layer are laminated, and the abundance ratio of the foreign matter with a maximum size of 100 to 500 μm is preferably 0.01 to 2.0 particles/m$^2$ in the barrier film. If the abundance ratio of the foreign matter is within those ranges, there is a tendency that the occurrence of defects can be more reliably reduced.

The quantum dot protective film preferably has a total light transmittance of 80% or more. As the total light transmittance is 80% or more, it becomes easier to ensure the display brightness by using just a small amount of electricity.

Furthermore, the quantum dot protective film preferably has a spectral transmittance of 70% or more at 450 nm. In particular, as the spectral transmittance is 70% or more at 450 nm, it becomes easier to ensure sufficient brightness when a blue LED is used as a light source.

Surface roughness Ra on a surface of the coating layer that is opposite the protective layer is preferably 0.2 μm or higher. If the surface roughness Ra is 0.2 μm or more, it becomes easier to suppress occurrence of interference fringes even when the quantum dot protective film is laminated with other members like a prism sheet and, at the same time, it also becomes easier to control the haze value of a quantum dot protective film to be 20% or more.

The present invention also provides a quantum dot protective film for sealing a phosphor, including: a protective layer having foreign matter, the maximum size of which is 100 to 300 μm; and a coating layer formed on one surface of the protective layer, wherein the abundance ratio of the foreign matter with the maximum size of 100 to 300 μm is 0.1 to 2.0 particles/m$^2$ in the protective layer, and the haze value is 20% or higher. According to the present invention, recognizable defects in a display can be reduced.

Also provided by the present invention is a quantum dot protective film for sealing a phosphor in which the quantum dot protective film is provided with a protective layer having foreign matter, the maximum size of which is 200 to 500 μm, and a coating layer formed on one surface of the protective layer, wherein the abundance ratio of the foreign matter having the average size of 200 to 500 μm is 3.0 particles/m$^2$ or less in the protective layer, and haze value of the quantum dot protective film is 20% or higher. According to the present invention, recognizable defects in a display can be reduced.

The present invention also provides a wavelength conversion sheet, including: a phosphor layer; and a first and a second quantum dot protective film for sealing the phosphor layer, wherein at least the first quantum dot protective film is the quantum dot protective film in which the protective layer is disposed to face the phosphor layer.

The present invention further provides a backlight unit, including: a light source composed of blue-color LEDs; and the wavelength conversion sheet, wherein in the wavelength conversion sheet, the quantum dot protective film which is disposed opposite to the light source while having the phosphor layer inserted therebetween is the first quantum dot protective film.

Advantageous Effects of Invention

According to the present invention, a quantum dot protective film, a wavelength conversion sheet, and a backlight unit that are capable of reducing recognizable defects in a display can be provided.

DESCRIPTION OF REPRESENTATIVE EMBODIMENTS

Figure 1:
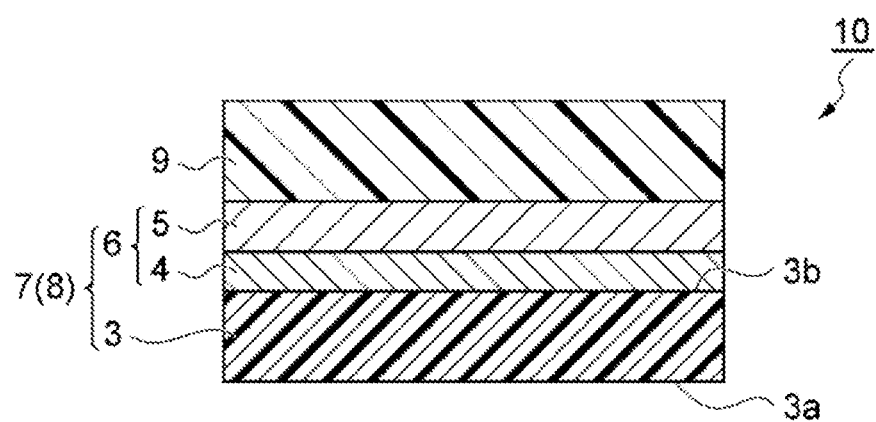
FIG. 1 is a schematic cross-sectional view illustrating the quantum dot protective film according to the first embodiment of the present invention.

Embodiments of the present invention will be described in detail below with reference to the drawings. In the drawings, the same or equivalent elements are given with the same reference symbol and redundant explanation is omitted. Further, although the description has been made with reference to a limited number of embodiments, the scope of the invention is not limited thereto, and modifications of the above embodiments on the basis of the above disclosure is obvious to a person having ordinary skill in the art. That is, the present invention may not be limited to the aforementioned embodiments. Design modifications or the like can also be made to the above embodiments on the basis of a knowledge of a skilled person in the art, and such modifications or the like without departing from the principle of the present invention are encompassed within the scope of the present invention.

[Quantum Dot Protective Film]

In the present invention, a quantum dot protective film is provided with a protective layer and a coating layer formed on one surface of the protective layer, and has a haze value of 20% or higher. The haze value is preferably 25% or higher, more preferably 40% or higher, and even more preferably 60% or higher. Furthermore, from the viewpoint of obtaining sufficient light transmittance, the haze value is preferably 95% or lower, and more preferably 90% or lower.

The haze value is an indicator representing turbidity of a film, and is a ratio of diffuse transmitted light relative to total transmitted light. Specifically, the haze value is obtained based on the following formula. Td in the following formula indicates diffuse transmittance, Tt indicates total light transmittance, and each of the diffuse transmittance and whole light transmittance can be measured by a haze meter or the like.

Haze value (%)=$Td/Tt \times 100$

In the protective layer, foreign matter with the maximum size of 100 to 500 μm is included, and a protective layer in which the abundance ratio of the foreign matter with the maximum size of 100 to 500 μm is 0.01 to 5.0 particles/m$^2$ can be used. For the protective layer, a protective layer in which foreign matter with the maximum size of 100 to 300 μm is included and the abundance ratio of the foreign matter with the maximum size of 100 to 300 μm is 0.1 to 2.0 particles/m$^2$ can be also used. When a material having a size of 100 μm or so is present in a quantum dot protective film, it can be visually recognized by a human eye. When a display device is produced with a film having such material, generally, it can easily produce display defect. However, as the quantum dot protective film of the present invention has a haze value of 20% or higher as described above, display defects can be suppressed even when a display device is produced with a protective layer having foreign matter. Similarly, even if dark sports occur in conjunction with deterioration of quantum dots, it is possible to suppress the dark spots from becoming a display defect. As a result, the yield of the quantum dot protective film and wavelength conversion sheet is enhanced, and from the viewpoint that, even when small dark spots are generated, they are not recognizable, the long term reliability of the wavelength conversion sheet can be improved. Meanwhile, if the maximum size of foreign matter is more than 500 μm, it may become impossible to suppress all display defects derived from the foreign matter. Even in a case in which the maximum size of foreign matter is more than 300 μm, the foreign matter may become a display defect depending on the haze value of a protective layer. Thus, for the protective layer, it is acceptable to use a protective layer not including foreign matter which has the maximum size of more than 500 μm, or to use a protective layer not including foreign matter which has the maximum size of more than 300 μm.

For the protective layer, it is acceptable to use a protective layer having foreign matter with an average size of 200 to 500 μm in which the abundance ratio of the foreign matter having the average size of 200 to 500 μm is 3.0 particles/m$^2$ or less. The foreign matter having the average size of 200 to 500 μm may include foreign matter which is long and thin like a line shape and rod shape, for example. As the average size is within the above range even when the maximum size is large, the foreign matter becomes hardly recognizable. In particular, as the abundance ratio of the foreign matter having the average size of 200 to 500 μm is 3.0 particles/m$^2$ or less, it is possible to further suppress the foreign matter from becoming a recognizable defect.

In the present specification, the foreign matter means a portion (lump) which can be recognized to be optically different from other portions of a protective layer when the protective layer is observed. The foreign matter may consist of a material which is different from the constituent material of the protective layer, or it may consist of a material which is the same as the constituent material of the protective layer. For a case in which the foreign matter consists of a material which is different from the constituent material of the protective layer, there is a possibility that adjacent motes or dust may be incorporated inside the protective layer during production of the quantum dot protective film, for example, and become foreign matter. Furthermore, for a case in which the foreign matter consists of a material which is the same as the constituent material of the protective layer, there is a possibility that a material for vapor deposition may not be vaporized from a vapor deposition source for forming an inorganic thin film layer and, in rare case, adheres to a protective layer in the form of large particles (vapor deposited powder), for example, and thus the particles become foreign matter.

As the abundance ratio of foreign matter is low, a display defect is reduced when a display device is produced. However, the characteristics of the present invention lie in that, even if foreign matter having the above maximum size is present at the above abundance ratio in the protective layer, it is possible to suppress the foreign matter from becoming a display defect. From this point of view, it is acceptable that the abundance ratio of foreign matter with the maximum size of 100 to 500 μm is 0.1 to 2.0 particles/m$^2$. It is also acceptable that the abundance ratio of foreign matter with the maximum size of 100 to 300 μm is 0.5 to 2.0 particles/m$^2$, or 0.8 to 2.0 particles/m$^2$. If the abundance ratio of foreign matter with the maximum size of 100 to 500 μm is more than 5.0 particles/m$^2$, or the abundance ratio of foreign matter with the maximum size of 100 to 300 μm is more than 2.0 particles/m$^2$, there can be a case in which not all of the display defects can be suppressed due to the increased maximum size resulting from overlapped foreign matter. Furthermore, if the abundance ratio of foreign matter with the maximum size of 100 to 500 μm is more than 5.0 particles/m$^2$, or the abundance ratio of foreign matter with the maximum size of 100 to 300 μm is more than 2.0 particles/m$^2$, there is a possibility that damage may be caused to the barrier layer 6.

Furthermore, in the present specification, the maximum size indicates a distance between two most distant points (length of the line connecting two points) in a portion that is recognized to be foreign matter in a plane S when observation of a protective layer is made from a direction perpendicular to the protective layer. Furthermore, when the length of the line A connecting two most distant points in a portion that is recognized to be foreign matter is set as $L_A$ and the length of the line B connecting two most distant points in a portion that is recognized to be foreign matter on the axis perpendicular to the line A on plane S is set as $L_B$, the average size $L_{AV}$ can be calculated from the following formula.

$L_{AV}=(L_A+L_B)/2$

With regard to the maximum size, average size, and abundance ratio of foreign matter, by using an optical detection device, for example, and identifying the foreign matter by image processing, the size of foreign matter can be measured based on the detected number of pixels.

Total light transmittance of the quantum dot protective film is preferably 80% or higher. As the total light transmittance is 80% or higher, it becomes easier to ensure the brightness of a display device even with low power consumption. Furthermore, if the total light transmittance is lower than 80%, loss of light from the light source is high and there is a risk that sufficient brightness of the display device may not be ensured or it becomes necessary to use a brighter light source to obtain the required brightness.

Spectral transmittance of the quantum dot protective film is preferably 70% or higher at 450 nm. When the spectral transmittance is 70% or higher at 450 nm, it becomes easier to ensure the brightness of the blue color of a display device, in particular, with low power consumption. When a blue LED is used as a light source, the wavelength of a blue LED is near 450 nm, and thus loss of light from the light source is high if the transmittance for light with a wavelength near 450 nm is low. For such reasons, there can be a case in which sufficient brightness of a display device, particularly of a blue color, cannot be ensured, or it becomes necessary to use a brighter light source to ensure sufficient brightness.

The quantum dot protective film of the present invention can have various structures from the aforementioned point of view. Hereinbelow, the structure of the quantum dot protective film of the present invention is explained more specifically.

First Embodiment

FIG. 1 is a schematic cross-sectional view illustrating the quantum dot protective film according to the first embodiment of the present invention. The quantum dot protective film 10 of FIG. 1 specifically has a configuration in which, on one surface 3b of a substrate layer 3, an inorganic thin film layer 4, a gas barrier coating layer 5, and a coating layer 9 are laminated in this order. Namely, according to the first embodiment, the protective layer 7 is obtained by lamination of the substrate layer 3, the inorganic thin film layer 4, and the gas barrier coating layer 5 in this order, and the coating layer 9 is formed on top of the gas barrier coating layer 5. When a wavelength conversion sheet is manufactured by using the quantum dot protective film 10 of this embodiment, the other surface 3a of the substrate layer 3 is arranged to face a phosphor layer. According to this embodiment, the thickness of the protective layer 7 is preferably 10 to 250 µm, and more preferably 16 to 150 µm, overall.

The substrate layer 3 is not particularly limited, and it is preferable to use a polyethylene terephthalate-based film or a polyethylene naphthalate-based film, for example. It is more preferable to use a polyethylene naphthalate-based film having an acid number (the number of mg of potassium hydroxide needed to neutralize free acid and other acidic substances contained in 1 g of the substrate layer 3 (film)) of 25 or less. Herein, if the acid number of the substrate layer 3 is more than 25, the substrate stability is impaired particularly in a high temperature and high humidity environment, and thus the barrier properties may be deteriorated. On the other hand, when the acid number is 25 or less, the substrate stability is improved so that the barrier properties tend to be stable without being deteriorated in a high temperature and high humidity environment.

Thickness of the substrate layer 3 is not particularly limited. It is preferably 3 µm or more and 200 µm or less, and more preferably 5 µm or more and 150 µm or less.

The inorganic thin film layer 4 and the gas barrier coating layer 5 that are formed on one surface 3b of the substrate layer 3 may be also referred to as a barrier layer 6. The inorganic thin film layer (inorganic oxide thin film layer) 4 is not particularly limited, and aluminum oxide, silicon oxide, magnesium oxide, or a mixture thereof can be used. From the viewpoint of barrier properties and productivity, aluminum oxide or silicon oxide is desirably used among them. Furthermore, from the viewpoint of water vapor barrier properties, silicon oxide is more desirably used.

The thickness (film thickness) of the inorganic thin film layer 4 is preferably in the range of 5 to 500 nm, and more preferably in the range of 10 to 300 nm. As the film thickness of the inorganic thin film layer 4 is 5 nm or more, a uniform film is easily obtained so that the barrier properties tend to be easily obtained. On the other hand, when the thickness of the inorganic thin film layer 4 is 500 nm or less, the flexibility can be maintained in the inorganic thin film layer 4, and there is a tendency of not having an occurrence of cracks in the film after being formed due to external factors such as bending, pulling, or the like.

The gas barrier coating layer 5 is formed to prevent various types of secondary wear and tear in the post processing and to impart even higher barrier property. Thickness (film thickness) of the gas barrier coating layer 5 is preferably 0.05 to 2.0 µm, and more preferably 0.1 to 1.0 µm. The gas barrier coating layer 5 is formed of a coating agent which includes as a component at least one selected from a group consisting of a hydroxyl group-containing polymer compound, metal alkoxide, metal alkoxide hydrolyzate, and metal alkoxide polymer. When the thickness of the gas barrier coating layer 5 is 0.05 µm or more, a uniform barrier property can be exhibited. On the other hand, when the thickness of the gas barrier coating layer 5 is 2.0 µm or less, the flexibility can be maintained and there is a tendency of not having an occurrence of cracks in the film after being formed, due to external factors such as bending, pulling, or the like.

Specifically, examples of the hydroxyl group-containing polymer compound include water-soluble polymers such as polyvinyl alcohol, polyvinyl pyrrolidone, and starch. The hydroxyl group-containing polymer is preferably polyvinyl alcohol from the viewpoint of the barrier properties.

The metal alkoxide is a compound that can be expressed by a chemical formula, $M(OR)_n$ (in the formula, M is a metal such as Si, Ti, Al, or Zr, and R is an alkyl group such as $CH_3$ and $C_2H_5$, and n is an integer from 1 to 4). The metal alkoxide specifically includes tetraethoxysilane $[Si(OC_2H_5)_4]$, triisopropoxy aluminum $[Al(O\text{-iso-}C_3H_7)_3]$, or the like. Among them, tetraethoxysilane or triisopropoxy aluminum is preferable because they are comparatively stable in an aqueous solvent after being hydrolyzed. Examples of hydrolyzates of the metal alkoxide include silicic acid $(Si(OH)_4)$ and the like as hydrolyzates of tetraethoxysilane, and aluminum hydroxide $(Al(OH)_3)$ as hydrolyzate of trispropoxy aluminum.

The coating layer 9 is provided on the surface of the quantum dot protective film 10, that is, the surface of the wavelength conversion sheet which will be described later, to exhibit the light scattering function. As the quantum dot protective film 10 is provided with the coating layer 9, an interference fringe (Moire) prevention function, anti-reflection function, and the like can be obtained in addition to the light scattering function. The quantum dot protective film 10 of this embodiment is characterized in that the coating layer 9 can provide at least the light scattering function.

The coating layer 9 is configured to include a binder resin and fine particles and to have part of the fine particles buried in the binder resin so as to be partially exposed from the surface of the coating layer 9. When the coating layer 9 has the above configuration, fine irregularities are produced on the surface of the coating layer 9 caused by the exposed fine particles. By having the coating layer 9 provided in this way on the surface of the quantum dot protective film 10, that is, on the surface of the wavelength conversion sheet which will be described later, the light scattering function can be exhibited.

It is preferable that the surface roughness Ra (arithmetic mean roughness) on a surface of the coating layer 9 of the quantum dot protective film 10, that is, on a surface of the coating layer 9 opposite to the protective layer 7, is preferably 0.2 μm or more. When the surface roughness Ra is 0.2 μm or more, the occurrence of interference fringe caused by adhesion between smooth films in case of having contact with another member like a prism sheet for constituting a backlight unit, for example, can be suppressed.

Examples of the binder resin which can be used include a thermoplastic resin, a thermosetting resin, and an ultraviolet curing resin.

Examples of the thermoplastic resin include cellulose derivatives, a vinyl-based resin, an acetal-based resin, an acryl-based resin, a polystyrene resin, a polyamide resin, a linear polyester resin, a fluorine resin, and a polycarbonate resin. Examples of the cellulose derivatives include acetyl cellulose, nitrocellulose, acetyl butyl cellulose, ethyl cellulose, and methyl cellulose. Examples of the vinyl-based resin include a vinyl acetate polymer and a copolymer thereof, a vinyl chloride polymer and a copolymer thereof, and a vinylidene chloride polymer and a copolymer thereof. Examples of the acetal resin include polyvinyl formal, and polyvinyl butyral. Examples of the acrylic resin include an acrylic polymer and a copolymer thereof, and a methacrylic polymer and a copolymer thereof.

Examples of the thermosetting resin include a phenol resin, a urea melamine resin, a polyester resin, and a silicone resin.

Examples of the ultraviolet curing resin include a photopolymerizable prepolymer such as an epoxy acrylate, urethane acrylate, polyester acrylate, or the like. Alternatively, it is possible that the above photopolymerizable prepolymer may be used as a main component and a monofunctional or polyfunctional monomer is used as a diluent.

The thickness (film thickness) of the binder resin layer except the portion having exposed fine particles in the coating layer 9 is preferably 0.1 to 20 μm, and more preferably 0.3 to 10 μm. When the film thickness of the binder resin layer is 0.1 μm or more, a uniform film is easily obtained so that there is a tendency that the optical functions are obtained at sufficient level. On the other hand, when the film thickness is 20 μm or less, the fine particles are exposed onto the surface of the coating layer 9 and the effect of imparting irregularities is likely to be exhibited. Furthermore, as the transparency is maintained, it becomes possible to conform to the trend of having a thinner film.

As for the fine particles, organic particles or inorganic particles can be used. These materials may be used singly or in combination of two or more types thereof.

Examples of the organic particles include spherical acrylic resin fine powder, nylon resin fine powder, ethylene tetrafluoride resin fine powder, cross-linked polystyrene resin fine powder, polyurethane resin fine powder, polyethylene resin fine powder, benzoguanamine resin fine powder, silicone resin fine powder, epoxy resin fine powder, polyethylene wax particles, and polypropylene wax particles. Examples of the inorganic particles include silica particles, zirconia particles, barium sulfate particles, titanium oxide particles, and barium oxide particles.

The fine particles preferably have an average primary particle diameter (also referred to as average particle diameter hereinbelow) of 0.5 to 20 μm. Herein, the average particle diameter indicates the volume average diameter that is measured by laser diffractometry. As the average particle diameter of the fine particles is 0.5 μm or more, there is a tendency that irregularities on the surface of the coating layer 9 can be effectively imparted. On the other hand, when the average particle diameter is 20 μm or less, the light transmittance can be maintained at high level without using particles with a size much larger than the thickness of the binder resin layer. Furthermore, as the average particle diameter is 20 μm or less, there is a tendency that a scratch on a light guide plate which is used for an LED backlight unit can be suppressed. It is preferable that the coating layer 9 contains 0.1 to 50 parts by mass of fine particles relative to 100 parts by mass of the binder resin. More preferably, it contains 2 to 20 parts by mass of fine particles. As the coating layer 9 contains the fine particles within the above range, close adhesiveness of a coating film can be maintained.

Furthermore, the coating layer 9 is not limited to a monolayer structure exhibiting the light scattering function, and it can be also a laminate which exhibits several functions.

The quantum dot protective film according to the first embodiment can be manufactured as described below. First, on one surface of the substrate layer 3, the inorganic thin film layer 4 is laminated by a vapor deposition method, for example. Next, a coating agent which contains, as a main agent, an aqueous solution or water/alcohol mixture solution containing a water-soluble polymer (hydroxyl group-containing polymer compound) and at least one of (a) one or more metal alkoxides and hydrolyzates thereof, and (b) tin chloride is applied on the surface of the inorganic thin film layer 4 followed by drying to form the gas barrier coating layer 5. Accordingly, a laminate (barrier film 8) having the barrier layer 6 formed on top of the substrate layer 3 is obtained. Next, on top of the barrier layer 6 of the laminate, a coating solution in which a binder resin is admixed with fine particles is applied followed by drying to form the coating layer 9. Accordingly, the quantum dot protective film 10 having the barrier layer 6 and the coating layer 9 laminated on top of the substrate layer 3 is obtained. Furthermore, in the present embodiment, the barrier film 8 becomes the protective layer 7.

In the barrier film 8, foreign matter with the maximum size of 100 to 500 μm is included, and it is possible to use a barrier film in which the abundance ratio of foreign matter with the maximum size of 100 to 500 μm is 0.01 to 2.0 particles/m². In the barrier film 8, the abundance ratio of foreign matter with the maximum size of 100 to 500 μm can be also 0.01 to 1.0 particles/m².

Second Embodiment

Figure 2:
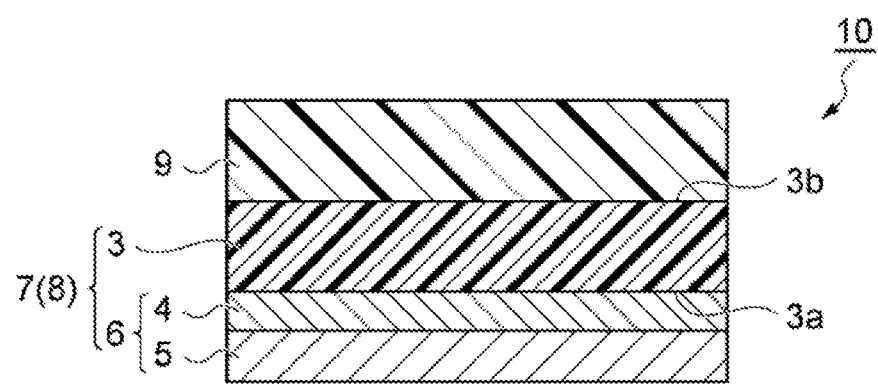
FIG. 2 is a schematic cross-sectional view illustrating the quantum dot protective film according to the second embodiment of the present invention.

FIG. 2 is a schematic cross-sectional view illustrating the quantum dot protective film according to the second embodiment of the present invention. The quantum dot protective film 10 according to the second embodiment is different from the quantum dot protective film 10 according to the first embodiment in that the coating layer 9 is formed on the substrate layer side surface of the protective layer 7. In FIG. 2, the quantum dot protective film 10 specifically has a configuration in which, on one surface 3b of the substrate layer 3, the coating layer 9 is laminated, and on the other surface 3a, the inorganic thin film layer 4 and the gas barrier coating layer 5 are laminated in this order. Namely, according to the second embodiment, the protective layer 7 is obtained by lamination of the substrate layer 3, the inorganic thin film layer 4, and the gas barrier coating layer 5 in this order, and the coating layer 9 is formed on the other surface 3b of the substrate layer 3. Furthermore, similar to the first embodiment, the barrier film 8 becomes the protective layer 7 in this embodiment. By preparing the barrier film 8 and forming the coating layer 9 on the substrate layer 3 of the barrier film 8, the quantum dot protective film 10 according to this embodiment is obtained. When a wavelength conversion sheet is manufactured by using the quantum dot protective film 10 of this embodiment, the quantum dot protective film 10 is disposed such that the gas barrier coating layer 5 faces a phosphor layer. By using the quantum dot protective film 10 of this embodiment for a wavelength conversion sheet, the barrier layer 6 can be formed more closely to a phosphor layer, and thus the barrier performance can be more effectively exhibited.

Third Embodiment

Figure 3:
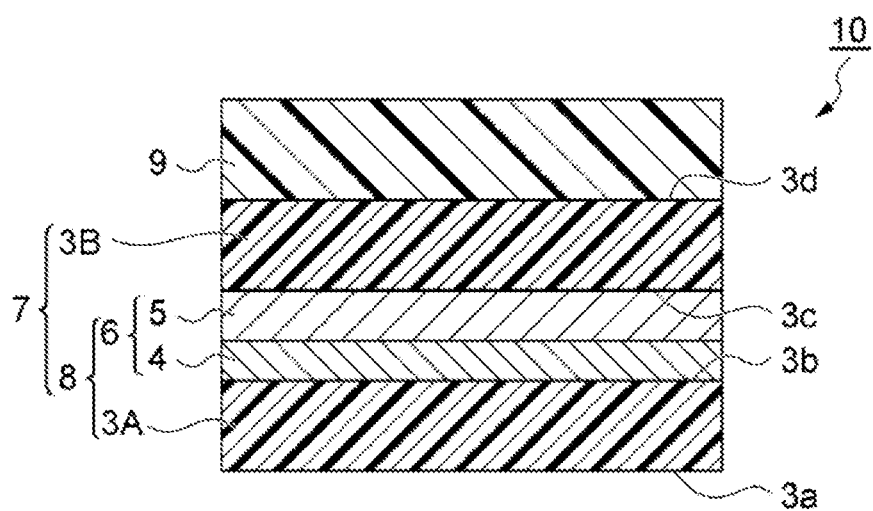
FIG. 3 is a schematic cross-sectional view illustrating the quantum dot protective film according to the third embodiment of the present invention.

FIG. 3 is a schematic cross-sectional view illustrating the quantum dot protective film according to the third embodiment of the present invention. The quantum dot protective film 10 according to the third embodiment is different from the quantum dot protective film 10 according to the first embodiment in that another substrate layer 3B is additionally formed on the gas barrier coating layer 5 to constitute the protective layer 7, and the coating layer 9 is formed on a surface of the other substrate layer 3B of the protective layer 7. In FIG. 3, the quantum dot protective film 10 specifically has a configuration in which, on one surface 3b of the first substrate layer 3A, the inorganic thin film layer 4, the gas barrier coating layer 5, the second substrate layer 3B, and the coating layer 9 are laminated in this order. Specifically, according to the third embodiment, the protective layer 7 is obtained by lamination of the first substrate layer 3A, the inorganic thin film layer 4, the gas barrier coating layer 5, and the second substrate layer 3B in this order, and the coating layer 9 is formed on one surface 3d of the second substrate layer 3B. It can be also said that the protective layer 7 is constituted such that the barrier layer 6 is inserted between one surface 3b of the first substrate layer 3A and the other surface 3c of the second substrate layer 3B. Furthermore, in this embodiment, the barrier film 8 is formed by lamination of the first substrate layer 3A, the inorganic thin film layer 4, and the gas barrier coating layer 5 in this order. By preparing the barrier film 8 and preparing a substrate layer provided with a coating layer according to forming of the coating layer 9 on the second substrate layer 3B, and also adhering the barrier film 8 and the substrate layer provided with a coating layer via an adhesive or the like (not illustrated) such that the barrier layer 6 faces the second substrate layer 3B, the quantum dot protective film 10 of this embodiment is obtained. When a wavelength conversion sheet is manufactured by using the quantum dot protective film 10 of this embodiment, the quantum dot protective film 10 is disposed such that the other surface 3a of the first substrate layer 3A faces a phosphor layer. Because the barrier layer 6 is inserted between the first and the second substrate layers 3A and 3B according to the quantum dot protective film 10 of this embodiment, the barrier performance can be more effectively exhibited even for a case of having defects like tiny pin holes occurring in the barrier layer 6.

Fourth Embodiment

Figure 4:
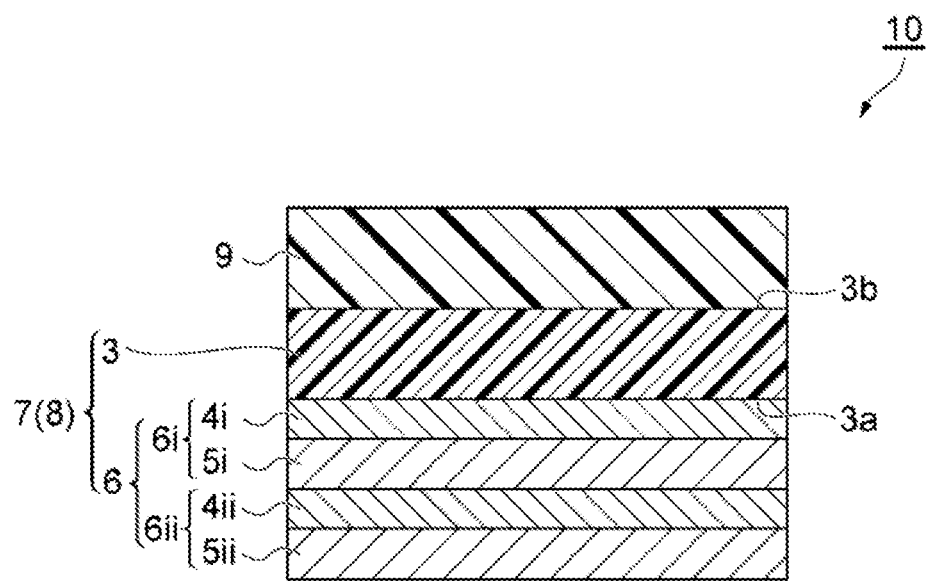
FIG. 4 is a schematic cross-sectional view illustrating the quantum dot protective film according to the fourth embodiment of the present invention.

FIG. 4 is a schematic cross-sectional view illustrating the quantum dot protective film according to the fourth embodiment of the present invention. The quantum dot protective film 10 according to the fourth embodiment is different from the quantum dot protective film 10 according to the first embodiment in that the coating layer 9 is formed on the substrate layer side surface of the protective layer 7 and two barrier layers 6i and 6ii are formed on the substrate layer 3. In FIG. 4, the quantum dot protective film 10 specifically has a configuration in which, on one surface 3b of the substrate layer 3, the coating layer 9 is laminated, and on the other surface 3a, the first inorganic thin film layer 4i, the first gas barrier coating layer 5i, the second inorganic thin film layer 4ii, and the second gas barrier coating layer 5ii are laminated in this order. Specifically, according to the fourth embodiment, the protective layer 7 is formed by lamination of the substrate layer 3, the first inorganic thin film layer 4i, the first gas barrier coating layer 5i, the second inorganic thin film layer 4ii, and the second gas barrier coating layer 5ii in this order, and the coating layer 9 is formed on the other surface 3b the substrate layer 3. Furthermore, the barrier film 8 is the same as the protective layer 7 in this embodiment. By preparing the barrier film 8 and forming the coating layer 9 on the substrate layer 3 of the barrier film 8, the quantum dot protective film 10 according to this embodiment is obtained. When a wavelength conversion sheet is manufactured by using the quantum dot protective film 10 of this embodiment, the quantum dot protective film 10 is disposed such that the second gas barrier coating layer 5ii faces a phosphor layer. According to the quantum dot protective film 10 of this embodiment, because two barrier layers 6i and 6ii are laminated, that is, the inorganic thin film layer and the gas barrier coating layer are alternately laminated, each in two layers, more excellent barrier performance can be exhibited.

Fifth Embodiment

Figure 5:
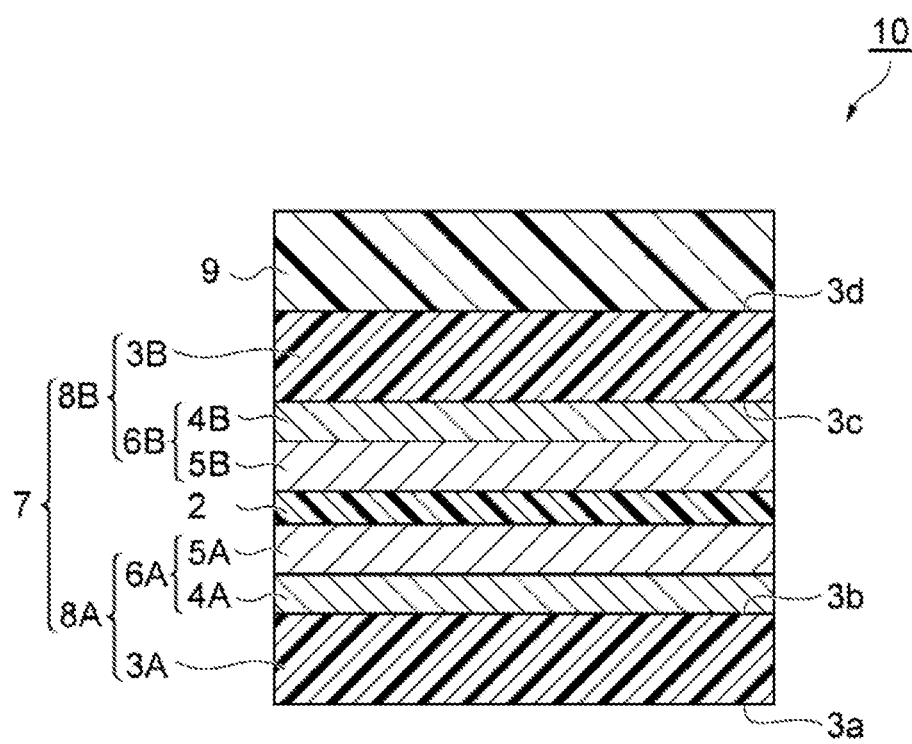
FIG. 5 is a schematic cross-sectional view illustrating the quantum dot protective film according to the fifth embodiment of the present invention.

FIG. 5 is a schematic cross-sectional view illustrating the quantum dot protective film according to the fifth embodiment of the present invention. The quantum dot protective film 10 according to the fifth embodiment is different from the quantum dot protective film 10 according to the first embodiment in that the protective layer 7 is provided with two barrier films 8A and 8B that are laminated via an adhesion layer 2 such that the barrier layers can face each other, and the coating layer 9 is formed on the substrate layer side surface of the protective layer 7. In this embodiment, the barrier film 8A has a configuration in which, on one surface 3b of the first substrate layer 3A, the first inorganic thin film layer 4A and the first gas barrier coating layer 5A are formed in this order, and the barrier film 8B has a configuration in which, on one surface 3c of the second substrate layer 3B, the second inorganic thin film layer 4B and the second gas barrier coating layer 5B are formed in this order. Specifically, according to the fifth embodiment, the protective layer 7 is formed by lamination of the first substrate layer 3A, the first inorganic thin film layer 4A, the first gas barrier coating layer 5A, the adhesion layer 2, the second gas barrier coating layer 5B, the second inorganic thin film layer 4B, and the second substrate layer 3B in this order, and the coating layer 9 is formed on the other surface 3d of the second substrate layer 3B. The inorganic thin film layer 4A and the gas barrier coating layer 5A that are formed on one surface 3b of the first substrate layer 3A may be referred to as a first barrier layer 6A, and the inorganic thin film layer 4B and the gas barrier coating layer 5B that are formed on one surface 3c of the second substrate layer 3B may be referred to as a second barrier layer 6B. When a wavelength conversion sheet is manufactured by using the quantum dot protective film 10 of this embodiment, the quantum dot protective film 10 is disposed such that the first substrate layer 3A faces a phosphor layer. According to the quantum dot protective film 10 of this embodiment, because the barrier films 8A and 8B are laminated, more excellent barrier performance can be exhibited.

Furthermore, for the barrier films 8A and 8B, it is possible to use a barrier film containing foreign matter with maximum size of 100 to 500 μm and an abundance ratio of foreign matter with the maximum size of 100 to 500 μm of 0.01 to 2.0 particles/m². In the barrier films 8A and 8B, the abundance ratio of foreign matter with the maximum size of 100 to 500 μm can be also 0.1 to 5.0 particles/m², 0.5 to 5.0 particles/m², or 0.01 to 2.0 particles/m². By attaching the barrier films 8A and 8B, it becomes easier to control the abundance ratio of the foreign matter with the maximum size of 100 to 500 μm to 0.01 to 5.0 particles/m² in the protective layer which is obtained by attaching the barrier films 8A and 8B, and thus recognizable defects on a display can be easily reduced. Furthermore, there is a risk of having lower gas barrier properties around the foreign matter if the barrier films 8A and 8B contain foreign matter. However, by attaching the barrier films 8A and 8B and having the abundance ratio of 2.0 particles/m² or less for foreign matter with the maximum size of 100 to 500 μm in each of the barrier films 8A and 8B, there is a tendency that each film functions to complement the gas barrier properties of the other and, when using the quantum dot protective film 10 for a wavelength conversion sheet, for example, local deterioration such as dark spots (dark points caused by inactivation of phosphors) or the like can be further suppressed.

It is preferable that the barrier films 8A and 8B do not have foreign matter which has a maximum size of more than 500 μm. Even when such foreign matter is present in the barrier films 8A and 8B, the abundance ratio of such foreign matter is preferably 0.1 particles/m² or less. For example, in a case in which the abundance ratio of spherical foreign matter with diameter of 500 μm is 2.0 particles/m² in the barrier films 8A and 8B, the probability of having partial overlap of foreign matter included in each barrier film in the gas barrier laminate obtained by attachment of them is about 6σ (3.4/1,000,000), and high quality tends to be maintained during the manufacturing process.

[Wavelength Conversion Sheet]

Figure 6:
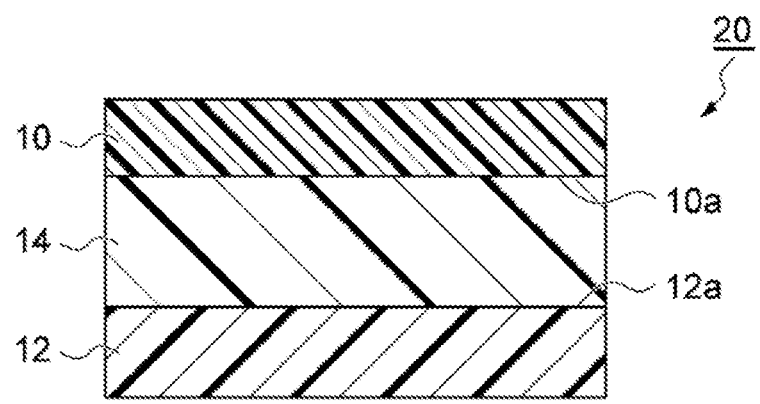
FIG. 6 is a schematic cross-sectional view illustrating the wavelength conversion sheet according to one embodiment of the present invention.

FIG. 6 is a schematic cross-sectional view illustrating the wavelength conversion sheet according to one embodiment of the present invention. As shown in FIG. 6, briefly, the wavelength conversion sheet 20 is constituted by being provided with the phosphor layer 14 using quantum dots, a first quantum dot protective film, which is formed on one surface of the phosphor layer 14 such that the protective layer 7 faces the phosphor layer 14, and a second quantum dot protective film formed on the other surface of the phosphor layer 14. In FIG. 6, the aforementioned quantum dot protective film 10 is used for the first quantum dot protective film while a quantum dot protective film 12, which is different from the aforementioned quantum dot protective film 10, is used for the second quantum dot protective film. More specifically, either directly or via a sealing resin, each of the first and the second quantum dot protective films 10 and 12 is laminated on both surfaces of the phosphor layer 14. Accordingly, the wavelength conversion sheet 20 has a configuration in which the phosphor layer 14 is applied (that is, sealed) between the first and the second quantum dot protective films 10 and 12. Furthermore, although the aforementioned quantum dot protective film 10 is used only for the first quantum dot protective film in FIG. 6, it is possible that at least one of the first and the second quantum dot protective films is the aforementioned quantum dot protective film, or both are aforementioned quantum dot protective films 10. Namely, the wavelength conversion sheet 20 of this embodiment is provided with the phosphor layer 14 and the first and the second quantum dot protective film for sealing the phosphor layer 14, and at least the first quantum dot protective film is the aforementioned quantum dot protective film 10 which is disposed such that the protective layer 7 can face the phosphor layer 14. For manufacturing a backlight unit by using the wavelength conversion sheet 20 of this embodiment, the quantum dot protective film 10 is disposed such that it can face the opposite side relative to a light source.

The phosphor layer 14 contains a resin and a phosphor. The thickness of the phosphor layer 14 is tens to hundreds of μm. For the resin, a photocurable resin or a thermocurable resin can be used, for example. The phosphor layer 14 preferably contains two kinds of phosphors composed of quantum dots. Furthermore, the phosphor layer 14 may be a laminate of 2 or more phosphor layers having a phosphor layer containing one kind of a phosphor and a phosphor layer containing another kind of a phosphor. The two kinds of phosphors are selected from those having the same excitation wavelength. The excitation wavelength is selected on the basis of the wavelength of the light irradiated by a light source. The phosphorescent colors of the two kinds of phosphors are different from each other. The phosphorescent colors are red and green. The phosphorescence wavelengths of each phosphor and the wavelength of the light irradiated by the light source are selected on the basis of spectrophotometric properties of the color filter. The phosphorescent peak wavelengths are, for example, 610 nm for red and 550 nm for green.

Next, the particle structure of the phosphor is explained. Preferably the phosphor used includes, in particular, core-shell quantum dots having good luminous efficiency. In core-shell quantum dots, a semiconductor crystal core as a light emitting part is coated with a shell as a protective film. Examples of the core which can be used include cadmium selenide (CdSe), and examples of the shell which can be used include zinc sulfide (ZnS). When surface defects of the CdSe particles are coated with ZnS having a large band gap, quantum yield is improved. The phosphor may also be formed with the core thereof being double-coated with a first shell and a second shell. For the core, CdSe can be used. For the first shell, zinc selenide (ZnSe) can be used, and for the second shell, ZnS can be used.

The phosphor layer 14 may have a monolayer constitution in which all the phosphors that convert light emitted from the light source into red, green, or the like are dispersed in a single layer, or it may have a multilayer constitution in which each phosphor is dispersed in several layers and the layers are laminated.

The structure of the second quantum dot protective film 12 is not particularly limited. The second quantum dot protective film 12 can be a laminate (barrier film) which is obtained by the process for producing the quantum dot protective film 10 that is described above. Specifically, it is possible that the second quantum dot protective film 12 has a structure in which the coating layer 9 is removed from the aforementioned quantum dot protective film 10.

Next, the method of manufacturing the wavelength conversion sheet 20 of this embodiment is explained with reference to FIG. 6. The method for forming the phosphor layer 14 is not particularly limited, and examples thereof include the method described in the specification of JP 2013-544018 A. By dispersing a phosphor in a binder resin, coating the prepared phosphor dispersion on a surface 10a of the first quantum dot protective film 10 opposite to the coating layer 9 (on a surface of the protective layer 7 side), attaching the second quantum dot protective film 12 on the coated surface, and curing the phosphor layer 14, the wavelength conversion sheet 20 can be manufactured. Alternatively, it is also possible that, by applying the phosphor dispersion on one surface 12a of the second quantum dot protective film 12, attaching the first quantum dot protective film 10 on the coated surface such that the coating layer 9 faces the opposite side relative to the phosphor layer 14 (such that the protective layer 7 can face the phosphor layer 14), and curing the phosphor layer 14, the wavelength conversion sheet 20 can be manufactured.

Furthermore, in FIG. 6, a constitution in which the phosphor layer 14 is directly sealed with the first and the second quantum dot protective films 10 and 12 is shown, but the present invention is not limited thereto. For example, it is also possible to have a constitution in which, separate from the phosphor layer 14, a sealing resin layer for covering and sealing the phosphor layer 14 is formed. By having a constitution in which a sealing resin layer is formed between the first and the second quantum dot protective films 10 and 12 to seal the phosphor layer 14, a wavelength conversion sheet having even higher barrier properties can be provided.

As explained in the above, according to the wavelength conversion sheet 20 of this embodiment, one quantum dot protective film laminated on the phosphor layer 14 (the first quantum dot protective film 10) has the coating layer 9 with optical function and the coating layer 9 is formed on the surface of the first quantum dot protective film 10, and thus foreign matter will not be recognized and also tiny dark spots (dark points) will not be recognized.

Furthermore, according to the wavelength conversion sheet 20 of this embodiment, because the first and the second quantum dot protective films 10 and 12 that are excellent in barrier property or transparency are used, a backlight unit for display which can exhibit the performance of quantum dots at the maximum level can be provided.

Furthermore, according to the wavelength conversion sheet 20 of this embodiment, because the first and the second quantum dot protective film 10 and 12 that are excellent in barrier properties or transparency are used, a display exhibiting more natural and clear color and excellent color hue can be provided.

[Backlight Unit]

Figure 7:
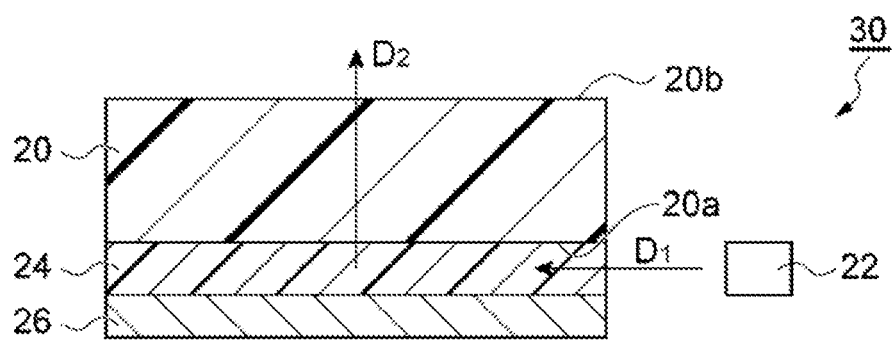
FIG. 7 is a schematic cross-sectional view illustrating the backlight unit according to one embodiment of the present invention.

FIG. 7 is a schematic cross-sectional view illustrating the backlight unit according to one embodiment of the present invention. In FIG. 7, the backlight unit 30 is provided with the light source 22 and the wavelength conversion sheet 20 in which the quantum dot protective film disposed on the opposite side of the light source 22 while having the phosphor layer 14 inserted therebetween corresponds to the aforementioned first quantum dot protective film. More specifically, in the backlight unit 30, the light guide plate 24 and the reflecting plate 26 are disposed in this order on a surface 20a on the second quantum dot protective film 12 side of the wavelength conversion sheet 20, and the light source 22 is disposed on the lateral side of the light guide plate 24 (in the planar direction of the light guide plate 24).

The light guide plate 24 and the reflecting plate 26 serve to efficiently reflect and guide light irradiated from the light source 22, and a known material is used for them. For the light guide plate 24, an acryl, a polycarbonate, a cycloolefin film, and the like are used.

In the light source 22, several diode elements having emission light with blue color are formed. After entering the light guide plate 24 (D1 direction), the light irradiated from the light source 22 enters the phosphor layer 14 (D2 direction) while being accompanied by reflection, diffraction, or the like. The light passing through the phosphor layer 14 is mixed with the blue light before passing through the phosphor layer 14, and emitted light with longer wavelength that is generated by excitation of the phosphor is caused by part of it (such as yellow light, red light, and green light), thus yielding white light.

EXAMPLES

The present invention is explained specifically herein below with reference to examples. However, the present invention is not limited to these examples.

[Preparation 1 of Quantum Dot Protective Film]

Example 1

A silicon oxide layer (the inorganic thin film layer 4, thickness: 250 Å) was formed on one surface of a bi-axially stretched polyethylene terephthalate film (substrate layer 3, product name: T60, thickness: 25 μm, manufactured by Toray Industries, Inc.) by vacuum vapor deposition. Furthermore, a composition consisting of alkoxysilane and polyvinyl alcohol was applied on the silicon oxide layer followed by drying to form the gas barrier coating layer 5 having a thickness of 0.3 μm, and a laminate (barrier film 8) composed of the substrate layer 3, the inorganic thin film layer 4, and the gas barrier coating layer 5 was obtained.

Next, on a surface of the gas barrier coating layer 5 of the laminate which has been prepared above, a composition consisting of 100 parts by mass of an acrylic resin (product name: ACRYDIC, manufactured by DIC Corporation) and 20 parts by mass of silica particles (product name: TOSPEARL 120, average particle diameter: 2.0 μm, manufactured by Momentive Performance Materials Inc.) was applied. According to curing of the acrylic resin by heating the coating film, the coating layer 9 with a thickness of 5 μm was formed on the gas barrier coating layer 5, and the quantum dot protective film 10 of Example 1 was obtained. The quantum dot protective film 10 of Example 1 has the configuration shown in FIG. 1, and in the quantum dot protective film 10, the part consisting of the substrate layer 3, the inorganic thin film layer 4, and the gas barrier coating layer 5 corresponds to the protective layer 7.

Example 2

The quantum dot protective film 10 of Example 2 was obtained according to the same process as Example 1 except that the addition amount of silica particles in the composition for forming the coating layer 9 is set at 15 parts by mass.

Example 3

The quantum dot protective film 10 of Example 3 was obtained according to the same process as Example 1 except that the addition amount of silica particles in the composition for forming the coating layer 9 is set at 10 parts by mass.

Example 4

The laminate (the barrier film 8) composed of the substrate layer 3, the inorganic thin film layer 4, and the gas barrier coating layer 5 was obtained according to the same method as Example 1. Next, on a surface of the substrate layer 3 of the laminate above, a composition consisting of 100 parts by mass of an acrylic resin (product name: ACRYDIC, manufactured by DIC Corporation) and 20 parts by mass of silica particles (product name: TOSPEARL 120, average particle diameter: 2.0 μm, manufactured by Momentive Performance Materials Inc.) was applied. According to curing of the acrylic resin by heating the coating film, the coating layer 9 with a thickness of 5 μm was formed on the substrate layer 3, and the quantum dot protective film 10 of Example 4 was obtained. The quantum dot protective film 10 of Example 4 has the configuration shown in FIG. 2, and in the quantum dot protective film 10, the part consisting of the substrate layer 3, the inorganic thin film layer 4, and the gas barrier coating layer 5 corresponds to the protective layer 7.

Example 5

The laminate (the barrier film 8) composed of the first substrate layer 3A, the inorganic thin film layer 4, and the gas barrier coating layer 5 was obtained according to the same method as Example 1. Furthermore, for the first substrate layer 3A, the same material as the substrate layer 3 of Example 1 was used. Next, on one surface of a bi-axially stretched polyethylene terephthalate film (second substrate layer 3B, product name: T60, thickness: 25 μm, manufactured by Toray Industries, Inc.), a composition consisting of 100 parts by mass of an acrylic resin (product name: ACRYDIC, manufactured by DIC Corporation) and 20 parts by mass of silica particles (product name: TOSPEARL 120, average particle diameter: 2.0 μm, manufactured by Momentive Performance Materials Inc.) was applied. According to curing of the acrylic resin by heating the coating film, the coating layer 9 with a thickness of 5 μm was formed on the second substrate layer 3B, and a substrate layer attached with coating was obtained. The substrate layer attached with coating and the laminated were disposed in overlaid form such that the surface 3c opposite to the surface of the second substrate layer 3B on which the coating layer 9 is formed can face the gas barrier coating layer 5, and by adhering them with an acrylic adhesive, the quantum dot protective film 10 of Example 5 was obtained. The quantum dot protective film 10 of Example 5 has a configuration shown in FIG. 3, and in the quantum dot protective film 10, the part consisting of the first substrate layer 3A, the inorganic thin film layer 4, the gas barrier coating layer 5, and the second substrate layer 3B corresponds to the protective layer 7.

Example 6

The laminate composed of the substrate layer 3, the first inorganic thin film layer 4i, and the first gas barrier coating layer 5i was obtained according to the same method as Example 1. Furthermore, for each of the first inorganic thin film layer 4i and the first gas barrier coating layer 5i, the same materials as the inorganic thin film layer 4 and the gas barrier coating layer 5 of Example 1 were used. On top of the first gas barrier coating layer 5i, a silicon oxide layer (the second inorganic thin film layer 4ii, thickness: 250 Å) was formed by a vacuum vapor deposition method. Furthermore, a composition consisting of alkoxysilane and polyvinyl alcohol was applied on the second inorganic thin film layer 4ii followed by drying to form the second gas barrier coating layer 5ii having a thickness of 0.3 μm. Accordingly, a laminate (the barrier film 8) composed of the substrate layer 3, the first inorganic thin film layer 4i, the first gas barrier coating layer 5i, the second inorganic thin film layer 4ii, and the second gas barrier coating layer 5ii was obtained. Next, on a surface of the substrate layer 3 of the above laminate which is obtained after forming the second inorganic thin film layer 4ii and the second gas barrier coating layer 5ii, a composition consisting of 100 parts by mass of an acrylic resin (product name: ACRYDIC, manufactured by DIC Corporation) and 20 parts by mass of silica particles (product name: TOSPEARL 120, average particle diameter: 2.0 μm, manufactured by Momentive Performance Materials Inc.) was applied. According to curing of the acrylic resin by heating the coating film, the coating layer 9 with a thickness of 5 μm was formed on the substrate layer 3, and quantum dot protective film 10 of Example 6 was obtained. The quantum dot protective film 10 of Example 6 has a configuration shown in FIG. 4, and in the quantum dot protective film 10, the part consisting of the substrate layer 3, the first inorganic thin film layer 4i, the first gas barrier coating layer 5i, the second inorganic thin film layer 4ii, and the second gas barrier coating layer 5ii corresponds to the protective layer 7.

Example 7

The quantum dot protective film of Example 7 was obtained according to the same method as Example 1 except that the coating layer 9 with a thickness of 10 μm was formed on the gas barrier coating layer 5 by using a composition consisting of 100 parts by mass of an acrylic resin (product name: ACRYDIC, manufactured by DIC Corporation) and 15 parts by mass of acryl particles (product name: ART PEARL, average particle diameter: 32 μm, manufactured by Negami Chemical Industrial Co., Ltd.).

Comparative Example 1

The quantum dot protective film of Comparative Example 1 was obtained according to the same method as Example 1 except that the coating layer is not formed.

[Method 1 for Evaluating Quantum Dot Protective Film]

The quantum dot protective films which have been obtained in Examples and Comparative Examples were measured by the following methods with regard to the abundance ratio of foreign matter, haze value, total light transmittance, transmittance for light with a wavelength of 450 nm (spectral transmittance), and surface roughness.

(Abundance Ratio of Foreign Matter)

By cleaning the coating layer side surface of the quantum dot protective films which have been obtained in the Examples and Comparative Examples with toluene, the coating layer was removed and the protective layer in the quantum dot protective film was obtained. Next, by using a line sensor camera, foreign matter with a maximum size of 100 to 500 μm in the protective layer was detected and the abundance ratio per unit area was calculated. Foreign matter with a maximum size of 100 to 300 μm in the protective layer was also detected in the same manner as above, and the abundance ratio per unit area was calculated. Furthermore, foreign matter with a maximum size of 200 to 500 μm in the protective layer was also detected, and the abundance ratio per unit area was calculated.

(Haze Value)

The haze value (%) of the quantum dot protective films obtained in the Examples and Comparative Examples was measured by using a haze meter (product name: NDH-2000, manufactured by Nippon Denshoku Industries Co., Ltd.). The measurement conditions were based on JIS K 7361-1. The measurement results of the haze value are shown in Table 1.

(Total Light Transmittance)

Total light transmittance (%) of the quantum dot protective films obtained in the Examples and Comparative Examples was measured by using a haze meter (product name: NDH-2000, manufactured by Nippon Denshoku Industries Co., Ltd.). The measurement conditions were based on JIS K 7136. The measurement results of the total light transmittance are shown in Table 1.

(Transmittance for Light with Wavelength of 450 nm)

Transmittance (%) of the quantum dot protective films obtained in the Examples and Comparative Examples for light with a wavelength of 450 nm was measured by using a spectrophotometer (product name: UV-2450, manufactured by Shimadzu Corporation). The measurement results of the transmittance for light with a wavelength of 450 nm are shown in Table 1.

(Surface Roughness)

Arithmetic mean roughness Ra (μm) on a surface of the coating layer of the quantum dot protective films obtained in the Examples and Comparative Examples (for Comparative Example 1, gas barrier coating layer) was measured by using a surface roughness measurement device (product name: SURF TEST, manufactured by Mitutoyo Corporation) based on JIS B 0601. The measurement results of the surface roughness Ra are shown in Table 1.

[Manufacture 1 of Wavelength Conversion Sheet]

The quantum dot protective film (the first quantum dot protective film) obtained from Example 1, and the laminate (the second quantum dot protective film) composed of a substrate layer, an inorganic thin film layer, and a gas barrier coating layer obtained from the Example 1 were prepared. Next, a phosphor having a core shell structure in which zinc sulfide (Zns) is coated on particles of selenium cadmium (CdSe) (product name: CdSe/ZnS 530, manufactured by Sigma-Aldrich Co., LLC.) and dispersed in a solvent followed by adjustment of the concentration, and thus a phosphor dispersion was prepared. The resulting phosphor dispersion was mixed with an epoxy-based photosensitive resin to obtain a phosphor composition. The phosphor composition was coated onto the gas barrier coating layer of the second quantum dot protective film, thereby forming a phosphor layer with a thickness of 100 μm.

The first quantum dot protective film was disposed for lamination on top of the obtained phosphor layer such that the surface of the film opposite to the coating layer (for Comparative Example 1, gas barrier coating layer) faces the phosphor layer, followed by curing the phosphor layer (photosensitive resin) by UV irradiation, thereby obtaining a wavelength conversion sheet using the quantum dot protective film of Example 1.

Furthermore, a wavelength conversion sheet using the quantum dot protective films of Examples 2 to 5 and 7 was obtained in the same manner as Example 1 except that, as the first quantum dot protective film, the quantum dot protective films obtained from Examples 2 to 5 and 7 are used.

Furthermore, a wavelength conversion sheet using the quantum dot protective film of Example 6 was obtained in the same manner as Example 1 except that, as the first quantum dot protective film, the quantum dot protective film obtained from Example 6 is used, and as the second quantum dot protective film, the laminate composed of a substrate layer, a first inorganic thin film layer, a first gas barrier coating layer, a second inorganic thin film layer, and a second gas barrier coating layer obtained from Example 6 is used.

Furthermore, a wavelength conversion sheet using the quantum dot protective film of Comparative Example 1 was obtained in the same manner as Example 1 except that, as the first quantum dot protective film, the quantum dot protective film obtained from Comparative Example 1 is used, and the first quantum dot protective film is disposed and laminated on top of a phosphor layer such that the gas barrier coating layer faces the opposite side relative to the phosphor layer.

[Method 1 for Evaluating Wavelength Conversion Sheet]

Presence or absence of display defects accompanied by foreign matter or the like was determined for the obtained wavelength conversion sheets according to the following method.

(Presence or Absence of Display Defects Accompanied by Foreign matter)

The obtained wavelength conversion sheet was exposed to an environment with a temperature of 85° C. for 1000 hours. The wavelength conversion sheet after exposure was irradiated with blue light from the second quantum dot protective film side. Then, the transmitted light was examined with the naked eye from the first quantum dot film side, and the presence or absence of display defects accompanied by foreign matter, scratches, wrinkles, dark spots, or the like was evaluated based on the following criteria. The evaluation results are shown in Table 1.

A: There was no defect that can be recognized by the naked eye.

B: Slight shaking of transmitted light was recognized by a naked eye but was not determined as a defect.

C: There was at least one defect that can be recognized by the naked eye.

TABLE 1

| | Quantum dot protective film | | | | | | | |
|---|---|---|---|---|---|---|---|---|
| | Protective layer Abundance ratio of foreign matter (pieces/m$^2$) | | | | Transmittance for light with | | | Wavelength conversion sheet |
| | Maximum size | | Average size | Haze value | Total light transmittance | wavelength of 450 nm | Surface roughness | Presence or absence of |
| | 100-500 μm | 100-300 μm | 200-500 μm | (%) | (%) | (%) | Ra (μm) | defects |
| Example 1 | 1.0 | 0.8 | 0.4 | 80 | 86 | 89 | 1 | A |
| Example 2 | 1.0 | 0.8 | 0.4 | 40 | 87 | 90 | 0.8 | A |
| Example 3 | 1.0 | 0.8 | 0.4 | 25 | 89 | 92 | 0.4 | A |
| Example 4 | 1.0 | 0.8 | 0.4 | 80 | 85 | 90 | 0.5 | A |
| Example 5 | 1.0 | 0.8 | 0.4 | 80 | 83 | 85 | 0.5 | A |
| Example 6 | 1.0 | 0.8 | 0.4 | 80 | 82 | 84 | 0.5 | A |

TABLE 1-continued

| | Quantum dot protective film | | | | | | Wavelength conversion sheet |
|---|---|---|---|---|---|---|---|
| | Protective layer Abundance ratio of foreign matter (pieces/m²) | | | | Transmittance for light with | | |
| | Maximum size | Average size | | Haze value | light transmittance | wavelength of 450 nm | Surface roughness | Presence or absence of |
| | 100-500 μm | 100-300 μm | 200-500 μm | (%) | (%) | (%) | Ra (μm) | defects |
| Example 7 | 1.0 | 0.8 | 0.4 | 90 | 70 | 78 | 15 | A |
| Comparative Example 1 | 1.0 | 0.8 | 0.4 | 5 | 90 | 93 | 0.02 | C |

As shown in Table 1, a display defect was not found in the wavelength conversion sheets in which the quantum dot protective film of Examples 1 to 7 is used, although the protective layer included foreign matter. Meanwhile, in Example 7, the area of exposed acryl particles is large on the surface of a coating layer and thus scratching on the light guide plate may be caused by this. Meanwhile, a display defect was found on the wavelength conversion sheet in which the quantum dot protective film of Comparative Example 1 is used.

[Preparation 2 of Quantum Dot Protective Film]

Example 8

On a single surface of a polyethylene terephthalate film with a thickness of 25 μm as the first substrate layer 3A, silicon oxide was formed as the first inorganic thin film layer 4A to have a thickness of 0.03 μm by a vacuum vapor deposition method of an electron beam heating type. The first substrate layer 3A formed with the first inorganic thin film layer 4A was cleaned with pure water, and a coating solution containing tetraethoxysilane and polyvinyl alcohol was applied by a wet coating method on top of the first inorganic thin film layer 4A after cleaning to form the first gas barrier coating layer 5A with a thickness of 0.6 μm. Accordingly, the first barrier film 8A having the 0.6 μm first barrier layer 6A which is composed of the first inorganic thin film layer 4A and the first gas barrier coating layer 5A and formed on one surface of the first substrate layer 3A was obtained. By following the same method, the second barrier film 8B having the 0.6 μm second barrier layer 6B which is composed of the second inorganic thin film layer 4B and the second gas barrier coating layer 5B and formed on one surface of the second substrate layer 3B was obtained. The first barrier film 8A and the second barrier film 8B were wound to have a roll shape.

Next, on a surface of the second substrate layer 3B of the second barrier film 8B wound from the roll, a composition consisting of 100 parts by mass of an acrylic resin (product name: ACRYDIC, manufactured by DIC Corporation) and 15 parts by mass of silica particles (product name: TOSPEARL 120, average particle diameter: 2.0 μm, manufactured by Momentive Performance Materials Inc.) was applied. According to curing of the acrylic resin by heating the coating film, the coating layer 9 with a thickness of 5 μm was formed on the second substrate layer 3B, and a barrier film having the coating layer attached was obtained.

Next, the barrier film having the coating layer and the first barrier film 8A were adhered by using a two-liquid curing type epoxy resin adhesive such that the second gas barrier coating layer 5B faces the first gas barrier coating layer 5A, and thus the quantum dot protective film 10 of Example 8 was obtained. The quantum dot protective film 10 of Example 8 has a configuration shown in FIG. 5, and in the quantum dot protective film 10, the part consisting of the first substrate layer 3A, the first inorganic thin film layer 4A, the first gas barrier coating layer 5A, the second inorganic thin film layer 4B, the second gas barrier coating layer 5B, and the second substrate layer 3B (including the adhesion layer) corresponds to the protective layer 7. By following the same operations, 2 pieces of the quantum dot protective film 10 of Example 8 were prepared. Furthermore, the haze value of the obtained quantum dot protective film 10 was found to be 40%.

Example 9

2 Pieces of the quantum dot protective film 10 of Example 8 were prepared by following the same method as Example 8 except that an acrylic adhesive was used for the adhesion layer for adhering the first barrier film 8A and the second barrier film 8B. Furthermore, the haze value of the obtained the quantum dot protective film 10 was found to be 40%.

Comparative Example 2

2 Pieces of the quantum dot protective film of Comparative Example 2 were prepared by following the same method as Example 8 except that, with regard to production of the first barrier film 8A, the gas barrier coating layer 5A was formed on top of the inorganic thin film layer 4A without cleaning the substrate layer 3A having the inorganic thin film layer 4A formed thereon, and, with regard to production of the second barrier film 8B, the gas barrier coating layer 5B was formed on top of the inorganic thin film layer 4B without cleaning the substrate layer 3B having the inorganic thin film layer 4B formed thereon. Furthermore, the haze value of the obtained quantum dot protective film was found to be 40%.

[Manufacture 2 of Wavelength Conversion Sheet]

A phosphor composition was obtained by mixing CdSe/ZnS 530 (product name, manufactured by Sigma-Aldrich Co., LLC.) as quantum dots and an epoxy-based photosensitive resin. The phosphor composition was applied on a surface of the first piece of the quantum dot protective film 10 obtained from Example 8, the surface not having the coating layer 9 formed thereon (the first substrate layer 3A). Then, the second piece of quantum dot protective film 10 was laminated on the applied surface such that the applied surface faces the first substrate layer 3A followed by UV curing lamination, and thus a wavelength conversion sheet in which the quantum dot protective film 10 of Example 8 is used was obtained.

[Method 2 for Evaluating Quantum Dot Protective Film]

By using an outer appearance tester provided with an in-line camera which has two lines of reflection and transmission, foreign matter having the maximum size and the average size of 100 to 700 μm in the protective layer was detected for about 1000 m² of the protective layer before forming a coating layer which has been used for production of a quantum dot protective film of Examples 8 and 9 and Comparative Example 2. Then, the abundance ratio per unit area was calculated for each maximum size and average size.

By using the aforementioned outer appearance tester, foreign matter having the maximum size and the average size of 100 to 700 μm was detected from the barrier layer-formed surface side of the barrier film which has been used for the production of the quantum dot protective film of Example 8. Then, the abundance ratio per unit area was calculated for each maximum size and average size. The evaluations results of the abundance ratio of the foreign matter are shown in Table 2.

[Method 2 for Evaluating Wavelength Conversion Sheet]

(Water Vapor Transmission Rate)

The quantum dot protective film obtained from the Examples and Comparative Examples was exposed to air of 85° C. for 1000 hours, and each of quantum dot protective films before and after the exposure was prepared. As for the water vapor transmission rate, the water vapor transmission rate of the quantum dot protective films obtained from Examples and Comparative Examples before and after the high temperature exposure was measured according to a method which is based on the infrared sensor method of JIS K 7129. The measurement results of the water vapor transmission rate before and after the high temperature exposure are described in Table 1. For the measurement of water vapor transmission rate, a water vapor transmission rate measurement device (product name: Permatran, manufactured by Mocon Inc.) was used. The temperature of the transmission cell was 40° C., the relative humidity of the high humidity chamber was 90% RH, and the relative humidity of the low humidity chamber was 0% RH.

(Presence or Absence of Display Defects Accompanied by Foreign Matter)

The obtained wavelength conversion sheet was exposed to an environment with temperature of 85° C. for 1000 hours. The wavelength conversion sheet after exposure was irradiated with blue light from the first piece quantum dot protective film side. Then, the transmitted light was examined with the naked eye from the second piece quantum dot film side, and the presence or absence of display defects accompanied by foreign matter, scratches, wrinkles, dark spots, or the like was evaluated based on the following criteria. The evaluation results are shown in Table 2.

A: There was no defect that can be recognized by the naked eye.

B: Slight shaking of transmitted light was recognized by the naked eye but was not determined as a defect.

C: There was a defect that can be recognized by the naked eye.

TABLE 2

| | | Example 8 Abundance ratio of foreign matter (particles/m²) | | Example 9 Abundance ratio of foreign matter (pieces/m²) | Comparative Example 2 Abundance ratio of foreign matter (particles/m²) |
|---|---|---|---|---|---|
| | | Barrier film | Protective layer | Protective layer | Protective layer |
| Maximum size of foreign matter | 100 μm or more and less than 200 μm | 0.25 | 0.68 | 1.32 | 1.31 |
| | 200 μm or more and less than 300 μm | 0.18 | 0.22 | 1.00 | 4.59 |
| | 300 μm or more and less than 400 μm | 0.06 | 0.13 | 0.69 | 1.43 |
| | 400 μm or more and less than 500 μm | 0.02 | 0.07 | 0.35 | 0.15 |
| | 500 μm or more and less than 600 μm | 0.05 | 0.05 | 0.19 | 0.22 |
| | 600 μm or more and less than 700 μm | 0.01 | 0.02 | 0.14 | 0.21 |
| | 100 to 500 μm | 0.51 | 1.10 | 3.36 | 7.48 |
| | 100 to 300 μm | 0.43 | 0.91 | 2.32 | 5.90 |
| Average size of foreign matter | 100 μm or more and less than 200 μm | 0.21 | 0.74 | 1.88 | 1.56 |
| | 200 μm or more and less than 300 μm | 0.20 | 0.24 | 1.21 | 4.69 |
| | 300 μm or more and less than 400 μm | 0.06 | 0.11 | 0.53 | 1.17 |
| | 400 μm or more and less than 500 μm | 0.03 | 0.06 | 0.22 | 0.19 |
| | 500 μm or more and less than 600 μm | 0.02 | 0.03 | 0.14 | 0.16 |
| | 600 μm or more and less than 700 μm | 0.02 | 0.01 | 0.04 | 0.17 |
| | 200 to 500 μm | 0.29 | 0.41 | 1.96 | 6.05 |
| Haze value (%) | | 40 | | 40 | 40 |
| Water vapor transmission rate (g/(m² · day)) | | 0.004 | | 0.004 | 0.010 |
| Presence or absence of display defects | | A | | B | C |

As shown in Table 2, no display defects were found from the wavelength conversion sheet in which the quantum dot protective film of Example 8 is used, although the protective layer included foreign matter. However, at least one display defect was found from the wavelength conversion sheet in which the quantum dot protective film of Comparative Example 2 is used, because the foreign matter is slightly large in the protective layer thereof. Furthermore, when compared to Examples 8 and 9, more foreign matter is contained in the protective layer of Comparative Example 2, so that the water vapor transmission has also slightly decreased. However, the decrease was at the level that is practically not problematic. Thus, the presence of foreign matter is more strictly controlled in a barrier film used for an image display device compared to a common barrier film which requires only a gas barrier, but according to the present invention, display defects can be reduced even if a certain amount of foreign matter is contained in the protective layer, and thus a quantum dot protective film allowing use suitable for an image display device can be provided.

REFERENCE SIGNS LIST 3, 3A, 3B Substrate layer, 4, 4i, 4ii, 4A, 4B Inorganic thin film layer, 5, 5i, 5ii, 5A, 5B Gas barrier coating layer, 6, 6i, 6ii, 6A, 6B Barrier layer, 7 Protective layer, 8, 8A, 8B Barrier film, 9 Coating layer, 10 (First) Quantum dot protective film, 12 Second quantum dot protective film, 14 Phosphor layer, 20 Wavelength conversion sheet, 30 Backlight unit

What is claimed is:

1. A quantum dot protective film for sealing a phosphor, comprising:
    a protective layer having foreign matter, a maximum size of which is 100 to 500 µm; and
    a coating layer formed on one surface of the protective layer, wherein
    an abundance ratio of the foreign matter with the maximum size of 100 to 500 µm is 0.01 to 5.0 particles/m$^2$ in the protective layer, and
    the haze value is 20% or higher, wherein the foreign matter is optically different from other portions of the protective layer.

2. The quantum dot protective film of claim 1, wherein the protective layer has the foreign matter with a maximum size of 100 to 300 µm, and the abundance ratio of the foreign matter with the maximum size of 100 to 300 µm is 0.1 to 2.0 particles/m$^2$.

3. The quantum dot protective film of claim 1, wherein the protective layer has the foreign matter with an average size of 200 to 500 µm and the abundance ratio of the foreign matter with an average size of 200 to 500 µm is 3.0 particles/m$^2$ or less.

4. The quantum dot protective film of claim 1, wherein
    the protective layer includes a barrier film in which a substrate layer and a barrier layer are laminated, and
    the abundance ratio of the foreign matter with the maximum size of 100 to 500 µm is 0.01 to 2.0 particles/m$^2$ in the barrier film.

5. The quantum dot protective film of claim 1, wherein the quantum dot protective film has a total light transmittance of 80% or higher.

6. The quantum dot protective film of claim 1, wherein the quantum dot protective film has a spectral transmittance of 70% or higher at 450 nm.

7. The quantum dot protective film of claim 1, wherein a surface roughness Ra on a surface of the coating layer that is opposite to the protective layer is 0.2 µm or higher.

8. A wavelength conversion sheet, comprising:
    a phosphor layer; and
    a first and a second quantum dot protective film for sealing the phosphor layer, wherein
    at least the first quantum dot protective film is the quantum dot protective film according to claim 1 in which the protective layer is disposed to face the phosphor layer.

9. A backlight unit, comprising:
    a light source composed of blue-color LED; and
    the wavelength conversion sheet according to claim 8, wherein
    in the wavelength conversion sheet, the quantum dot protective film which is disposed opposite to the light source while having the phosphor layer inserted therebetween is the first quantum dot protective film.

10. The quantum dot protective film of claim 1, wherein the foreign matter consists of a material, which is different from a constituent material of the protective layer.

11. The quantum dot protective film of claim 1, wherein the foreign matter consists of a material, which is the same as a constituent material of the protective layer.

12. The quantum dot protective film of claim 11, wherein the protective layer is a vapor deposited inorganic thin layer and wherein the foreign matter is in a form of a vapor deposited powder adhered to the protective layer.

* * * * *